United States Patent
Mitra et al.

(10) Patent No.: US 7,523,371 B2
(45) Date of Patent: *Apr. 21, 2009

(54) SYSTEM AND SHADOW BISTABLE CIRCUITS COUPLED TO OUTPUT JOINING CIRCUIT

(75) Inventors: Subhasish Mitra, Folsom, CA (US); Ming Zhang, Urbana, IL (US); Kee Sup Kim, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 643 days.

This patent is subject to a terminal disclaimer.

(21) Appl. No.: 11/218,979

(22) Filed: Sep. 2, 2005

(65) Prior Publication Data

US 2006/0015786 A1      Jan. 19, 2006

Related U.S. Application Data

(63) Continuation-in-part of application No. 11/128,692, filed on May 12, 2005, now Pat. No. 7,373,572, and a continuation-in-part of application No. 11/050,996, filed on Feb. 4, 2005, now Pat. No. 7,278,076, and a continuation-in-part of application No. 11/044,826, filed on Jan. 26, 2005, now Pat. No. 7,278,074, and a continuation-in-part of application No. 10/882,523, filed on Jun. 30, 2004, now Pat. No. 7,188,284.

(51) Int. Cl.
*G01R 31/28* (2006.01)
*G06F 7/02* (2006.01)
*G06F 13/00* (2006.01)

(52) U.S. Cl. .................... 714/729; 714/819

(58) Field of Classification Search ............ None
See application file for complete search history.

(56) References Cited

U.S. PATENT DOCUMENTS

| 5,253,255 A | 10/1993 | Carbine |
| 5,742,190 A | 4/1998 | Banik et al. |
| 5,742,192 A | 4/1998 | Banik |
| 6,023,778 A | 2/2000 | Li |
| 6,654,944 B1 | 11/2003 | Dike |
| 6,735,731 B2* | 5/2004 | Ewen et al. ............ 714/733 |
| 2003/0046643 A1 | 3/2003 | Ohta et al. |
| 2003/0222677 A1 | 12/2003 | Komaki |
| 2004/0041610 A1* | 3/2004 | Kundu ............... 327/215 |
| 2005/0207521 A1* | 9/2005 | Lee et al. ........... 375/355 |
| 2007/0016823 A1* | 1/2007 | Jang et al. ........... 714/6 |

* cited by examiner

*Primary Examiner*—Christine T Tu
(74) *Attorney, Agent, or Firm*—Schwabe, Williamson & Wyatt, P.C.

(57) ABSTRACT

In one embodiment, an apparatus is provide with a combinational logic circuit to generate a data input signal; a delay element, coupled to the combinational logic circuit, to provide a delayed data input signal in response to the data input signal. Additionally, the apparatus is provided with a system bistable circuit, coupled to the combinational logic circuit, to generate a system bistable signal in response to at least the data input signal; a shadow bistable circuit, coupled to the delay element, to generate a shadow bistable signal in response to at least the delayed data input signal. Further, the apparatus is provided with an output joining circuit, coupled to the system and the shadow bistable circuits, to provide a data output signal in response to the system and the shadow bistable signals.

34 Claims, 11 Drawing Sheets

SYSTEM AND SHADOW BISTABLE CIRCUITS COUPLED TO OUTPUT JOINING CIRCUIT

CROSS-REFERENCE TO RELATED APPLICATIONS

This application is a continuation-in-part of: (a) U.S. patent application Ser. No. 10/882,523 ("523"), filed Jun. 30, 2004, now U.S. Pat. No. 7,188,284 entitled "Error Detecting Circuit"; (b) U.S. patent application Ser. No. 11/044,826 ("826"), filed Jan. 26, 2005, now U.S. Pat. No. 7,278,074 entitled "System and Shadow Circuits with Output Joining Circuit"; (c) U.S. patent application Ser. No. 11/050,996 ("996"), filed Feb. 4, 2005, now U.S. Pat. No. 7,278,076 entitled "System and Scanout Circuits with Error Resilience Circuit"; and (d) U.S. patent application Ser. No. 11/128,692 ("692"), filed May 12, 2005, now U.S. Pat. No. 7,373,572 entitled "System Pulse Latch and Shadow Pulse Latch Coupled to Output Joining Circuit", and this application claims priority to the '523, '826, '996 and '692 applications.

BACKGROUND

1. Technical Field

Embodiments of the present invention are related to the field of electronic devices, and in particular, to errors in electronic devices.

2. Description of Related Art

Single event upsets (SEUs), also referred to as soft errors, are radiation-induced transient errors in digital systems caused by high energy particles such as neutrons generated from cosmic rays and alpha particles from packaging material. Soft errors may be significant for microprocessors, network processors, high end routers and network storage components that target enterprise and applications where high reliability, data integrity and availability are desirable.

Sequential circuits, such as bistable circuits (e.g., latches and flip-flops), may be major contributors to the system-level soft error rate. In addition to soft errors in bistable circuits, the digital systems also may be susceptible to single event transients (SETs), which are soft errors originating in combinational logic circuits that drive the latches and flip-flops.

DETAILED DESCRIPTION OF ILLUSTRATIVE EMBODIMENTS

Figure 1:
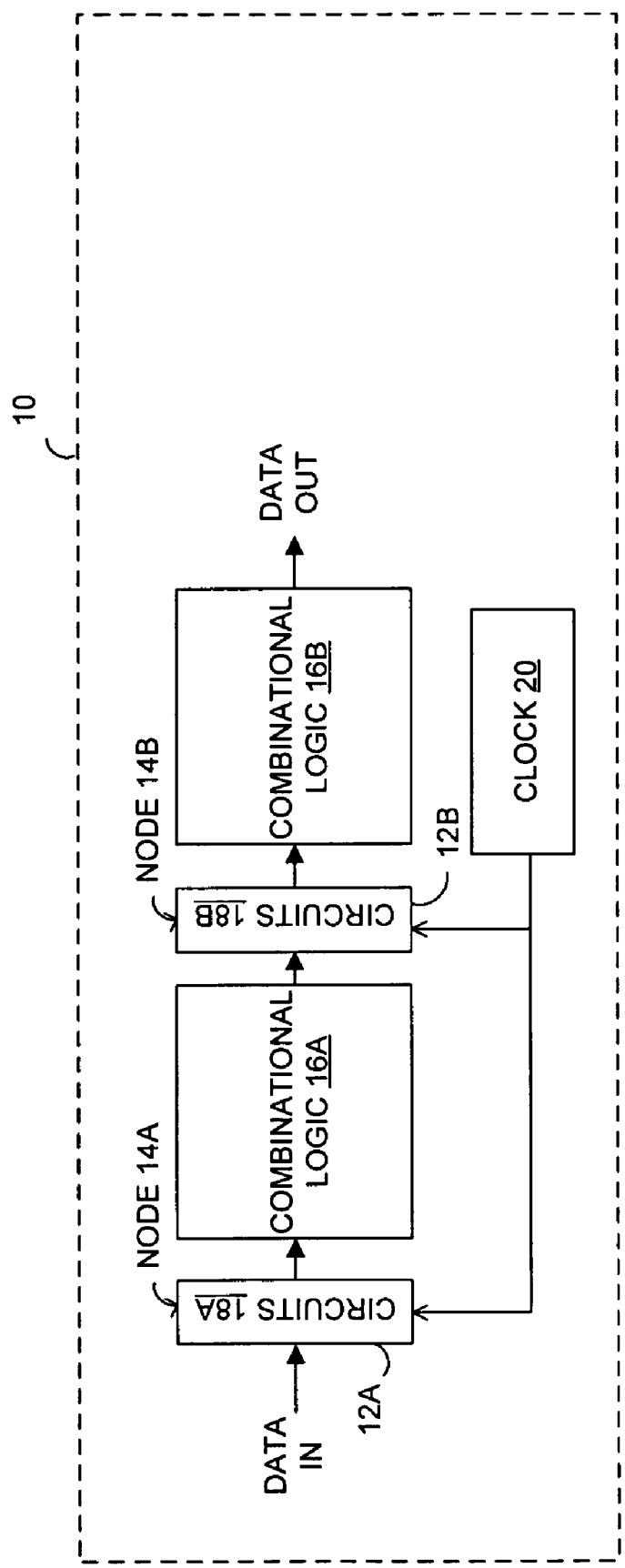
FIG. 1 is a block diagram of the integrated circuit (IC) chip with bistable cells, according to the various embodiments of the present invention.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Various embodiments according to the present invention are directed toward enabling bistable circuits (e.g., latches and flip-flops) with built-in resilience (hardening, self-checking or correcting) to single event upsets (SEUs) occurring in the bistable circuits, while also providing protection against single event transients (SETs) occurring in combinational logic circuits interposed between the bistable circuits. More specifically, in a first group of embodiments according to the present invention, two parallel bistable circuits, a system and a shadow bistable circuit, may be provided, with the outputs of the system and shadow bistable circuits being coupled together by an output joining circuit for the purpose of providing hardening to soft errors caused by SEUs. In a second group of embodiments according to the present invention, two parallel bistable circuits, a system and a shadow bistable, may be provided, with the outputs of the system and shadow bistable circuits being coupled by an output joining circuit for the purpose of detecting soft errors caused by SEUs. In the second and third groups of embodiments, protection against SETs occurring in the combinational logic circuit may be undertaken by interposing a delay element between the combinational logic circuit and a data input terminal of one of the bistable circuits. In a third group of embodiments according to the present invention, correction of the errors may be accomplished by using three bistable circuits.

In a scan/scanout circuit reuse group of embodiments according to the present invention, the shadow bistable circuits in an IC design may already exist for scan and/or scanout testing purposes. For example, the reuse group of embodiments may already include redundant bistable circuits in an IC design for scan Design-For-Testability (DFT), which may be adapted for hardening to soft errors or for detecting soft errors. Without this additional use for hardening to errors or detecting errors, the shadow bistable circuit for the scan or scanout purpose would not be used during normal (functional) operation. Hence, this group of embodiments incorporates a "reuse" concept for already-existing dual bistable circuits. In another group of embodiments, the shadow bistable circuits may not already exist for scan or scanout purposes; hence, they may be duplicated for the purpose of error hardening, error self-checking, or correction. In another group of embodiments according to the present invention, a non-protected mode may be provided wherein the shadow bistable may be disabled, for example, to save power. With these embodiments, the delay element may be positioned in front of the shadow bistable circuit.

Referring to FIG. 1, there is illustrated an integrated circuit (IC) chip 10, according to the various embodiments of the present invention. The IC chip 10 is simplified to show only registers 12 (two illustrative registers 12A and 12B shown) at nodes 14 (two illustrative nodes 14A and 14B shown) and combinational logic circuits 16 (two illustrative combinational logic circuits 16A and 16B shown) interposed between nodes 14. In one embodiment, each register 12 may be an N-bit-wide clocked register; hence, each register 12 may have N bistable cells 18 (two illustrative bistable cells 18A and 18B shown) to receive an N-bit wide data input signal DATA IN. Each bistable cell 18 may include a system bistable circuit and a shadow bistable circuit with clock input terminals commonly coupled to a clock source 20 to receive a clock signal; data input terminals to receive a data input signal; and output terminals coupled to an output joining circuit for error hardening or error detection. In order to protect against SETs, a delay element may be coupled between the combinational circuit and the data input terminal of one of the bistable circuits so as to delay the data input signal with respect to one but not both bistable circuits. Depending upon the clocking arrangement, the system and shadow bistable circuits may be latches or flip-flops (master-slave latches).

In summary, the bistable cell 18, according to the various embodiments of the invention, may be characterized as to whether it is implemented with latches or flip-flops and as to whether the output joining circuit is implemented to achieve hardening against soft errors, self-checking for soft errors, or correction of soft errors. This leads to six general categories of the bistable cell 18: a hardened latch cell, a hardened flip-flop cell, a self-checking latch cell, a self-checking flip-flop cell, an error correcting latch cell and an error correcting flip-flop cell. Each of these categories of bistable cells 18 may or may not also include scan/scanout circuit reuse and may or may not include a non-protected mode of operation, as will be described hereinafter. The embodiments in each of these categories include a delay element to provide protection against SETs. Hence, the bistable cell may not only provide resilience against soft errors that occur inside the bistable cells, but may also provide resilience against soft errors occurring inside the combinational logic circuits that drive the bistable cells. Various illustrative embodiments according to the present invention of the bistable cell 18 will now be described in detail.

Figure 2:
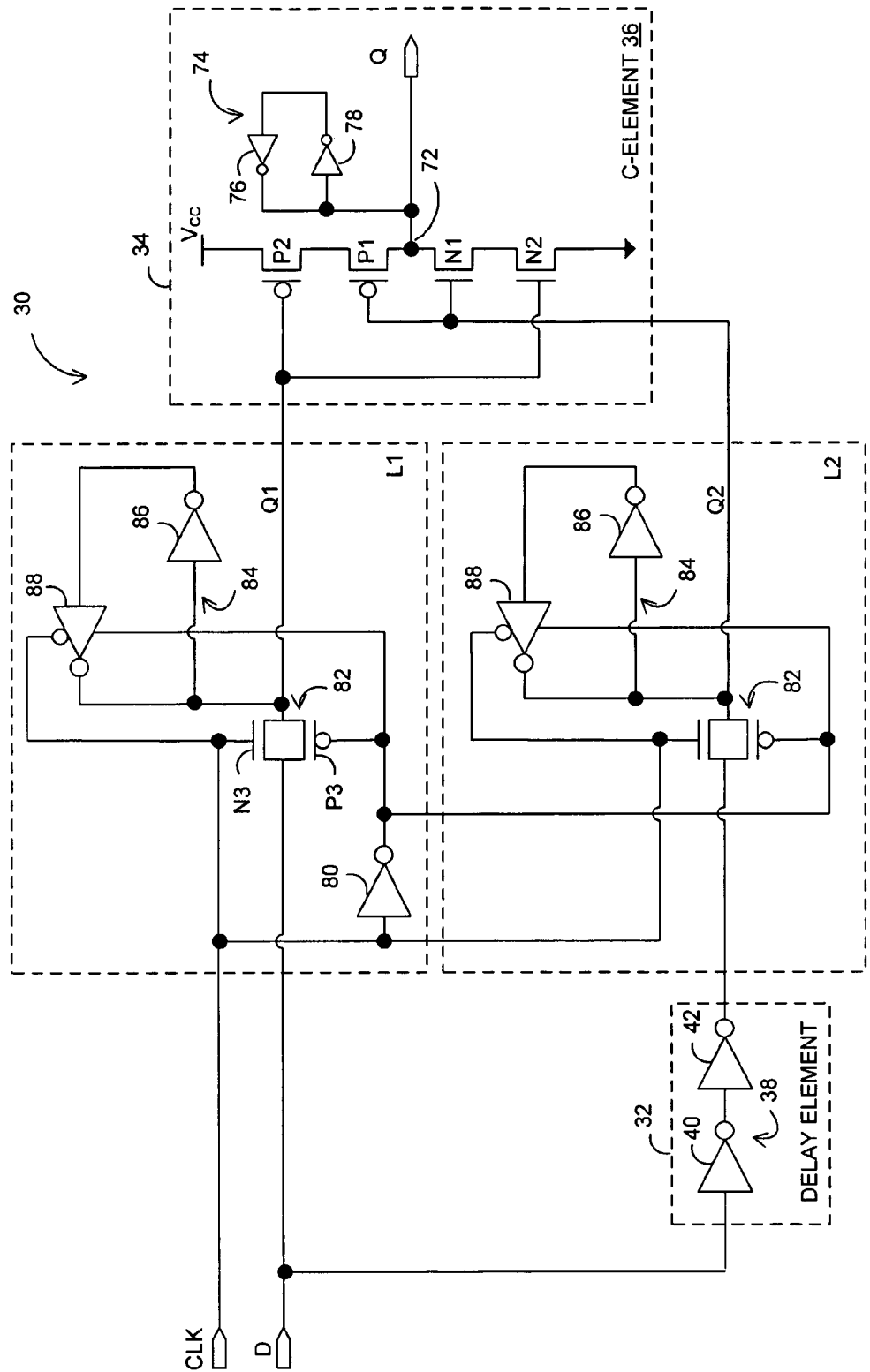
FIG. 2 is a circuit schematic of a hardened latch cell, according to one embodiment of the present invention.

Referring to FIG. 2, a bistable cell 18 of FIG. 1 may take the form of hardened latch cell 30, according to one embodiment of the present invention. The hardened latch cell 30 may include system and shadow bistable circuits in the form of a system latch L1 and a shadow latch L2, respectively. In one embodiment, a data input signal D from an upstream combinational logic circuit (see FIG. 1) may be coupled to data input terminals of the latches L1 and L2, with the data input signal D passing through a delay element 32 interposed in front of one of the latches L1 and L2. In the illustrative embodiment of FIG. 2, the delay element 32 is shown coupled between the upstream combinational logic circuit (not shown) and the shadow latch L2. A system clock signal CLK may be commonly coupled to clock input terminals of the latches L1 and L2. The system clock signal CLK may be generated from the clock source (see FIG. 1). In one embodiment, a system bistable signal Q1 may be generated by the system latch L1 on its system bistable output terminal Q1. A shadow bistable signal Q2 may be generated by the shadow latch L2 on its shadow bistable output terminal Q2. The bistable signals Q1 and Q2 may be provided as inputs to an output joining circuit 34. In the embodiment of FIG. 2, the output joining circuit 34, in response to the bistable signals Q1 and Q2, may provide on its output terminal a data output signal Q with resilience (hardening) against soft errors. In one embodiment, the output joining circuit 34 may be a hardened circuit in the form of a C-element 36 as shown in FIG. 2. However, the output joining circuit 34 may take a number of different forms to undertake hardening to soft errors or detection of soft errors, as will be discussed hereinafter.

The delay element 32 may be placed in front of either of the latches L1 and L2, since the latches are the same and the cell 30 only needs the data input signal to be delayed with respect to one of the latches L1 and L2, but not both. In other words, a relative delay of the input data signal received by the latches is needed, so that one latch receives the input data signal and the other latch receives thereafter a delayed data input signal. However, throughout this specification and the claims, the term "shadow" is used with respect to the bistable (latch or flip-flop) having the delay element in front of it (and therefore receiving the delayed data input signal) and the term "system" is used with respect to the bistable (latch or flip-flop) not having the delay element in front of it.

With respect to SETs, even though the system clock signal CLK may be continuously applied, the data input signals are not moved into and out of the latches L1 and L2 simultaneously, due to the delay element 32. Instead, the delay element 32 may introduce a time redundancy or delay so that a SET may not influence the contents of both latches L1 and L2 simultaneously. More specifically, when the latches L1 and L2 are in their transparency mode, the SET and the delayed SET in the input data signal and the delay input data signal, respectively, may be staggered so as not to overlap when received by the output joining circuit 34. Likewise, when the latches L1 and L2 transition from their transparency mode to their hold mode, a SET at most may be latched into only one of the latches L1 and L2 and not both. During the hold mode, SETs have no impact upon the outputs of the latches L1 and L2. Hence, a correct value may be set at the output of the C-element 36 by the data input signal D when both latches L1 and L2 are in their transparent mode.

Figure 3:
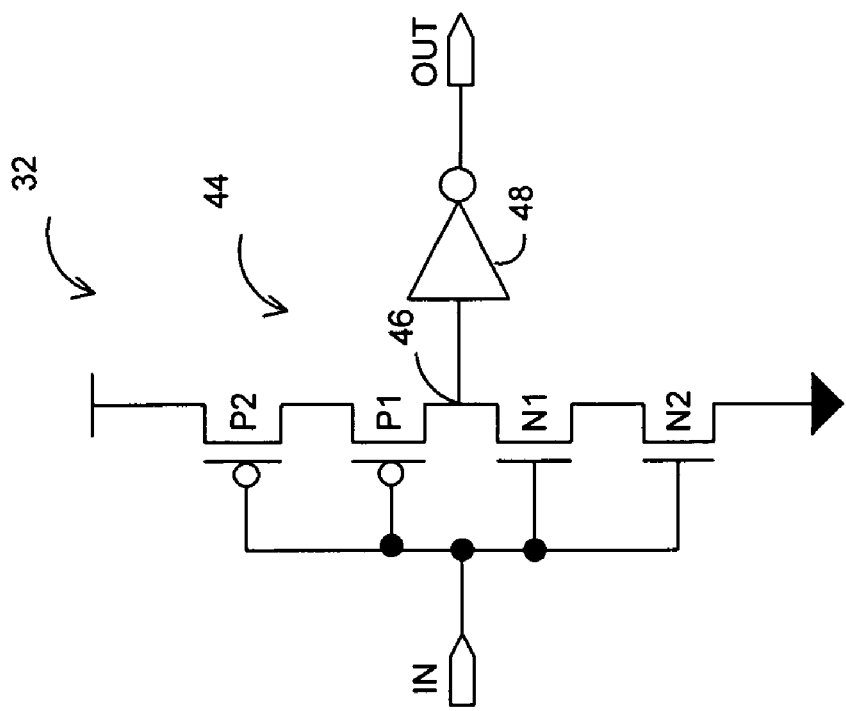
FIG. 3 is a circuit schematic of another embodiment of a delay element for the latch cell of FIG. 2, according to one embodiment of the present invention.

In one embodiment, the delay element 32 in FIG. 2 is shown as an inverter chain 38 formed by two series coupled inverters 40 and 42. However, the delay element 32 may take many different forms, including hardwired and programmable versions. In general, hardwired versions of the delay element 32 may be realized by cascading an even number of complementary metal oxide semiconductor (CMOS) logic gates, such as inverters or NAND/NOR gates. For example, another hardwired version of the delay element 32 comprises a stacked-transistor inverter chain 44 shown in FIG. 3. The stacked-transistor inverter chain 44 may include series coupled P-channel transistors P1 and P2 and N-channel transistors N1 and N2 with gates coupled to the data input signal IN (which is D in FIG. 2) and with an output node 46 coupled to an inverter 48 to provide a delayed data input signal OUT. The transistors P2 and N2 may be sized to provide the right amount of delay. Generally, the stacked-transistor inverter 44 may provide more delay than the inverter chain 38 of FIG. 2, if needed.

Figure 4:
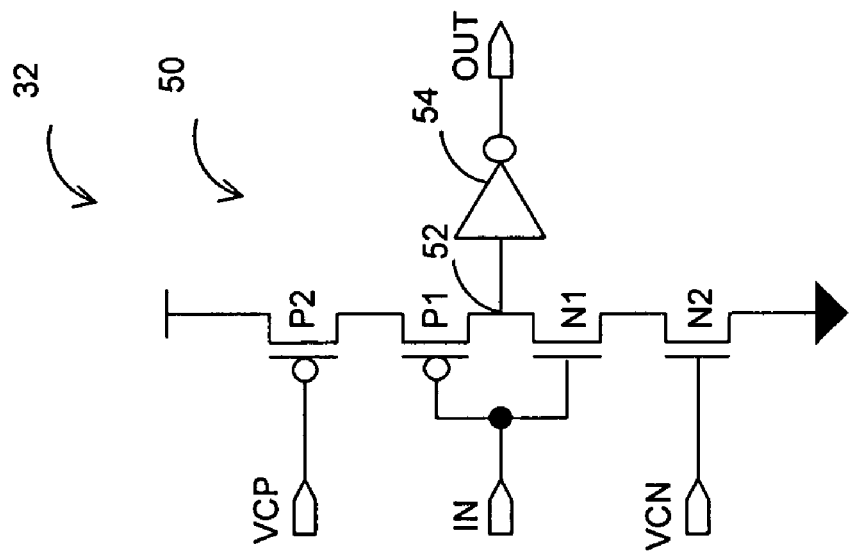
FIG. 4 is a circuit schematic of another embodiment of the delay element for the latch cell of FIG. 2, according to one embodiment of the present invention.

In other embodiments, the delay element 32 may be a programmable or tunable delay element, based on the principle of current starved inverter, for example. FIG. 4 illustrates one embodiment of a programmable version of the delay element 32 in the form of an analog, voltage-controlled inverter chain 50. The inverter chain 50 may have gates of a P-channel transistor P1 and an N-channel transistor N1 coupled to the data input signal IN (data input signal D of FIG.

2) and gates of a P-channel transistor P2 and an N-channel transistor N2 coupled to analog voltages VCP and VCN, respectively. An output signal from an output node 52 is provided to an inverter 54, which in turn provides a delayed data input signal OUT. The analog voltages VCP and VCN control the inverter chain 50. More specifically, the delay of the inverter chain 50 may increase as VCN decreases and VCP increases. In other words, the delay may reach a minimum as VCN=VCC and VCP=VSS (ground). Voltages VCN and VCP may be driven by a current mirror (not shown), which may use only one control voltage.

Figure 5:
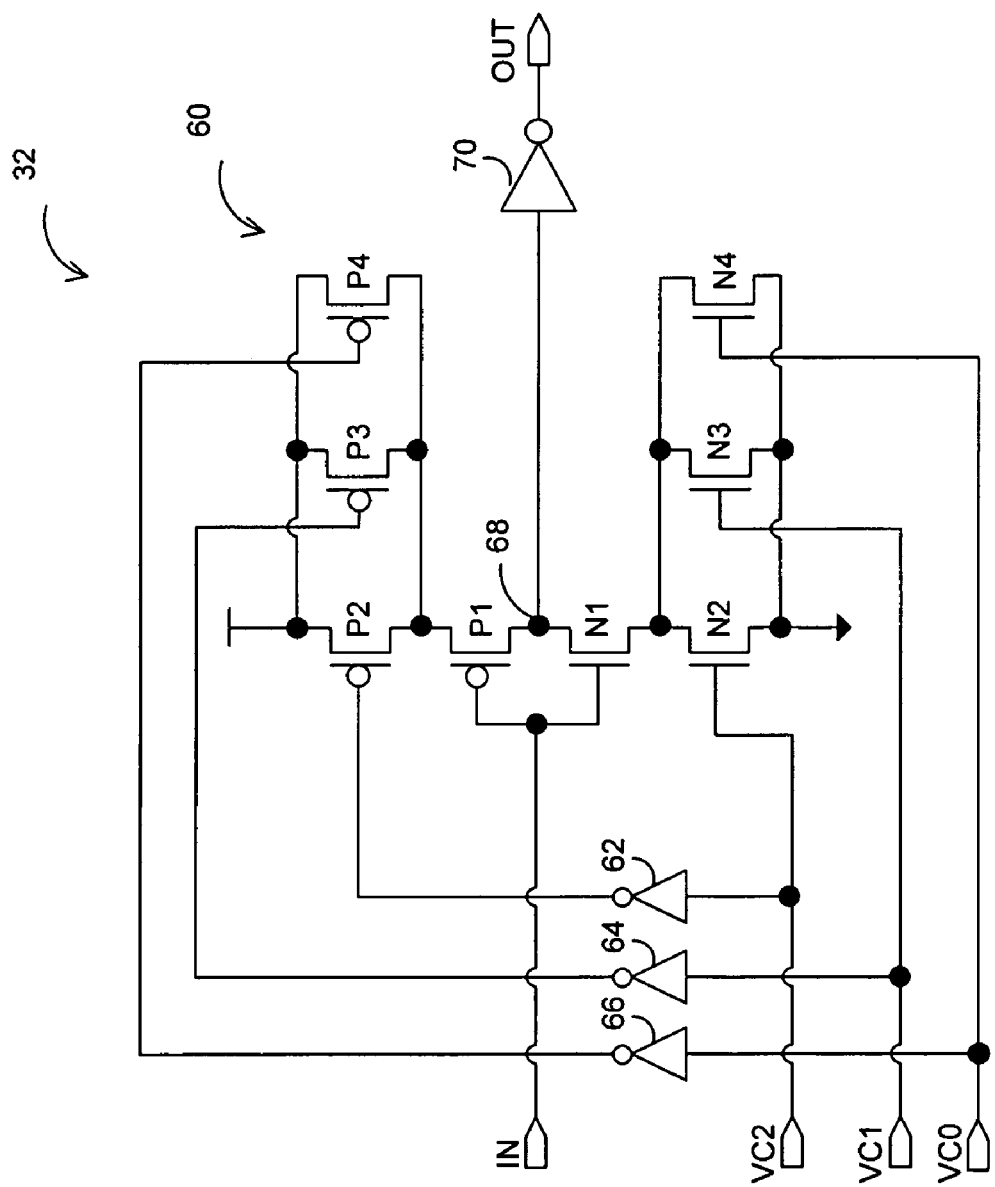
FIG. 5 is a circuit schematic of another embodiment of the delay element for the latch cell of FIG. 2, according to one embodiment of the present invention.

Referring to FIG. 5, the delay element 32 of FIG. 2 may take the form of a digital, voltage-controlled inverter chain 60, which may be controlled by a digital control vector VC0, VC1 and VC2. The inverter chain 60 may have gates of a P-channel transistor P1 and an N-channel transistor N1 coupled to the data input signal IN (data input signal D of FIG. 2). Gates of P-channel transistors P2, P3, and P4 may be coupled to the vector values VC2, VC1, and VC0, respectively, through inverters 62, 64, and 66, respectively. Gates of N-channel transistors N2, N3, and N4 may be coupled to the vector values VC2, VC1, and VC0, respectively. An output node 68 may be coupled through an inverter 70 to provide a delayed data input signal OUT.

Referring back to FIG. 2, although the output joining circuit 34 is a hardening circuit for error hardening. In one embodiment, the hardening circuit may take the form the C-element 36; however, the hardening circuit may take different forms. In another embodiment, the output joining circuit 34 may simply comprise coupling the system latch output terminal Q1 and the shadow latch output terminal Q2 together so that the system latch signal Q1 and the shadow latch signal Q2 combine to produce the data output signal Q. In another embodiment, the output joining circuit 34 be a transmission gate (see FIG. 9) coupled between the system and the shadow bistable output terminals Q1 and Q2 so that the system bistable signal Q1 and the shadow bistable signal Q2 are coupled together to produce the data output signal Q when the transmission gate is enabled. The transmission gate may also decouple the signals Q1 and Q2 when the transmission gate is disabled.

In FIG. 2, the C-element circuit 36 may be CMOS implementation. The C-element circuit 36 may include two series-coupled P-channel transistors P1 and P2 in a pull-up path and two series-coupled N-channel transistors N1 and N2 in a pull-down path. More specifically, the transistor P2 may have its source coupled to the external supply voltage $V_{CC}$ and its drain coupled to the source of transistor P1. The transistor P1 may have its drain connected to an output node 72 for the data output signal Q. The transistor N1 may have its drain coupled to the output node 72 and its source may be connected to the drain of the transistor N2. The transistor N2 may have its source coupled to ground. The gates of transistors N2 and P2 may be commonly coupled to a system bistable signal Q1 of the system latch L1. The gates of transistors N1 and P1 may be commonly coupled to the shadow bistable signal Q2 of the shadow latch L1.

The output of the C-element circuit 36 may be low upon both the signals Q1 and Q2 being high. The output of the C-element may be high upon the signals Q1 and Q2 being low. For all other input combinations, the output of the C-element circuit 36 may hold its previous value. The data output signal Q at the data output terminal Q of the C-element circuit 36 may be actively driven only if the contents of two latches L1 and L2 match (signal Q1=signal Q2). If any latch signal is erroneous due to a particle strike, the signal Q1 will not agree with signal Q2 and the correct state may be at the data output terminal Q. It is assumed that there is only a "single" event upset (SEU), wherein a particle strike can at most flip the contents of one of the latches L1 or L2, but not both.

In one embodiment, a keeper circuit 74, which may include two inverters 76 and 78, may be coupled to the C-element circuit 36. In another embodiment, the keeper circuit 74 may not be needed. The keeper circuit 74 may fight leakage current in the C-element circuit 36 when both the pull-up and the pull-down paths in the C-element circuit 36 are shut off. Depending on the process technology and the clock frequency, the keeper circuit 74 may be desirable. A particle strike in the keeper circuit 74 is less likely to cause an error at the data output terminal Q, because both latches L1 and L2 hold correct logic values under single event upset (SEU) assumption; hence, the Q output node may be strongly driven by the C-element circuit 36. The addition of the keeper circuit 74 does not change the operation of the C-element circuit 36. The term "C-element circuit" is not intended to include the keeper circuit 74.

Referring to FIG. 2, there is shown an illustrative latch design which may be used for the latches L1 and L2. In one embodiment, as shown in FIG. 2, the latches L1 and L2 may have essentially the same design. Moreover, this design is repeated throughout many of the embodiments described hereinafter. It should be appreciated that this latch design is just one of many possible latch designs which may be used with the various embodiments of the present invention. Since the latch design remains the same throughout several of the embodiments, it retains the same reference numbers (or the reference numbers will not be shown) in these embodiments and will be described only once with respect to the latch L1 of FIG. 2. In one embodiment, the latches L1 and L2 may have be designed to use a clock cycle with a 50% duty cycle. In another embodiment, the latches L1 and L2 may be designed to be pulse latches, wherein the clock cycle has a duty cycle that is substantially less than 50%.

With respect to latch L1, the system clock signal CLK may be coupled to a gate of a P-channel transistor P3 through an inverter 80 and a gate of an N-channel transistor N3. The data input signal D may be commonly coupled to the source of the transistor N3 and the source of the transistor P3. The transistors N1 and N2 may form a pass gate 82 to allow the data input signal D to reach a storage element 84, formed by an inverter 86 and a tri-state enable inverter 88. The tri-state enable inverter 88 may have three input terminals, one input coupled to the output of the inverter 86, one coupled to clock signal CLK, and one coupled to the inverted clock signal. When the system clock signal CLK is low, the transistors N3 and P3 are off, preventing the data input signal D from reaching the storage element 84. When the system clock signal CLK is high, the transistors N3 and P3 are turned "on" so as to allow the data input signal D to reach the storage element 84 and thereby be provided at a bistable output terminal Q1 as a bistable signal Q1. More specifically, the pass gate 82 of the latch L1 may be turned on at one edge of the clock pulse (e.g., the rising edge) and may be turned off at the second edge of the clock pulse (e.g., the falling edge). When the pass gate 82 of the latch L1 is turned on, the data input signal D is passed on to the storage element 84. The value of the data input signal D at the time the pass gate 82 is turned off is maintained by the storage element 84. Consequently, the bistable signals Q1 is maintained at the bistable output Q1 until the next rising edge of another clock pulse of the system clock signal CLK is received. Any changes in the data input signal D will not be stored in the latch L1 while the pass gate 82 is turned off. Latch L2 may have the same design, except the inverter 80 does not need to be repeated—latch L2 may use the inverter 80 of latch L1. In another embodiment, the latches L1 and L2 and the output joining circuit 34 may be designed using differential logic.

Figure 6:
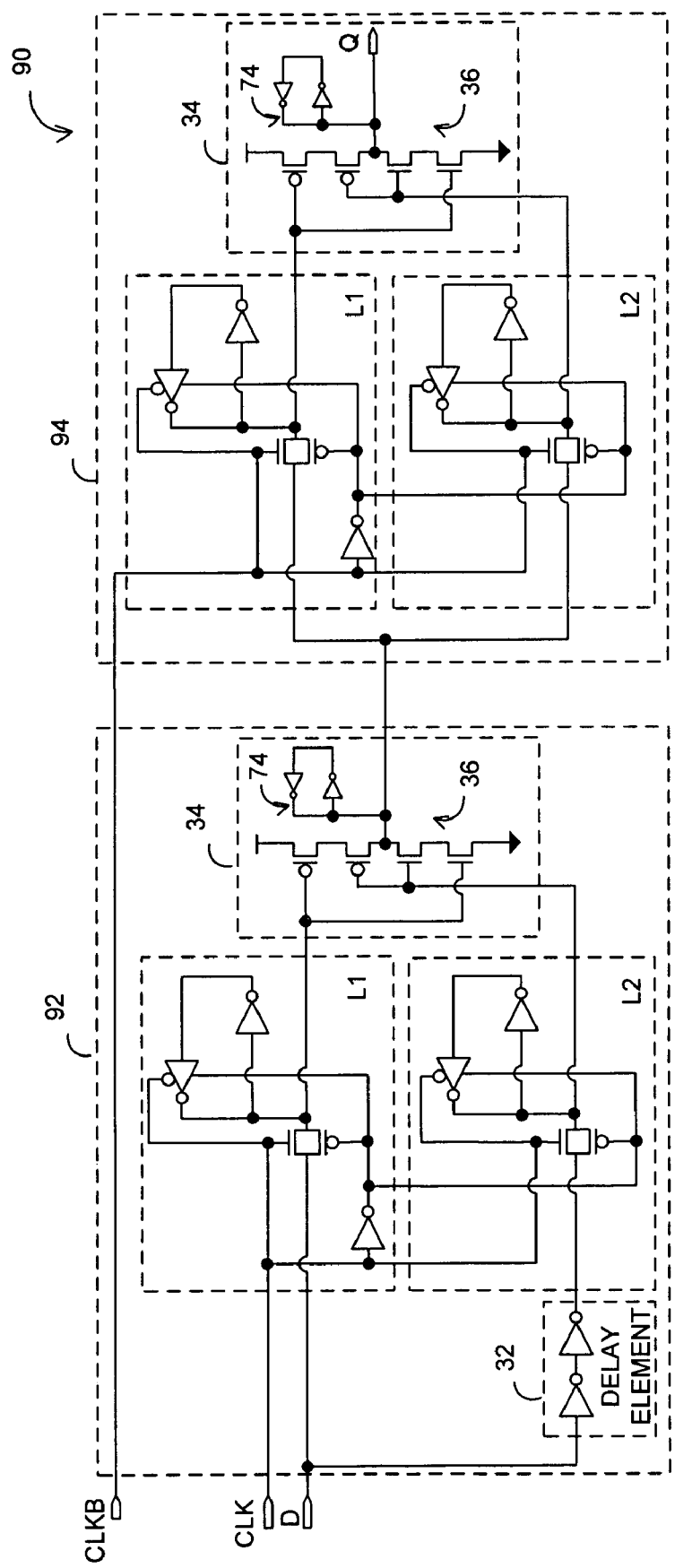
FIG. 6 is a circuit schematic of a hardened flip-flop cell, according to one embodiment of the present invention.

Referring to FIG. 6, the bistable cell 18 of FIG. 1 may take the form of a hardened flip-flop (master-slave latches) cell 90. The hardened flip-flop cell 90 may include two cascaded hardened latch cells 92 and 94 configured in a master-slave relationship. More specifically, the output of the first latch cell 92 (master latch) becomes the input to the second latch cell 94 (slave latch). In addition to a clock signal CLK being provided to the latch cell 92, a clock signal CLKB is provided to the latch cell 94, which is an inverted from the clock signal CLK (180 degrees out of phase). In one embodiment, the latch cells 92 and 94 may have the same design of the hardened latch cell 30 of FIG. 2; hence, each of the latch cells 92 may include a system latch L1, a shadow latch L2, and an output joining circuit 34. However, the delay element 32, which delays the data input signal D, may be included in front of the first latch cell 92 and does not need to be repeated for the second latch cell 94. As with the hardened latch cell 30 of FIG. 2, the delay element 32 may take various different forms, with some of these forms being illustrated in FIGS. 3, 4 and 5. Likewise, the output joining circuit 34 may take forms different than the C-element, as explained with respect to the hardened latch cell 30 of FIG. 2. Also, the latches L1 and L2 are merely illustrative of any number of latch designs that may be used in the hardened flip-flop cell 90.

For the purposes of illustration, the hardened flip-flop cell 90 is shown with positive edge-triggered flip-flops using two phases of the same system clock source (see FIG. 1), which include the clock signal CLK (non-inverted phase) and clock signal CLKB (inverted phase). An inverter (not shown) may provide the inverted phase. However, in another embodiment, two different clock sources may be used for the clock signals CLK and CLKB. In yet another embodiment, the same clock phase may be used with both stages of flip-flops formed by cascading a negative latch (master latch) and a positive latch (slave latch). Likewise, a flip-flop cell may be constructed with negative edge-triggered flip-flops which may be used and constructed according to the same principles. Other combinations are possible. The keeper circuit 74 after the master latch cell 92 may not be needed if the clock signal can be manipulated to have a duty cycle less than 50%. This means that the master latch cell 92 only needs to retain data for a small fraction of the cycle time, during which leakage current may not pose a problem.

Figure 7:
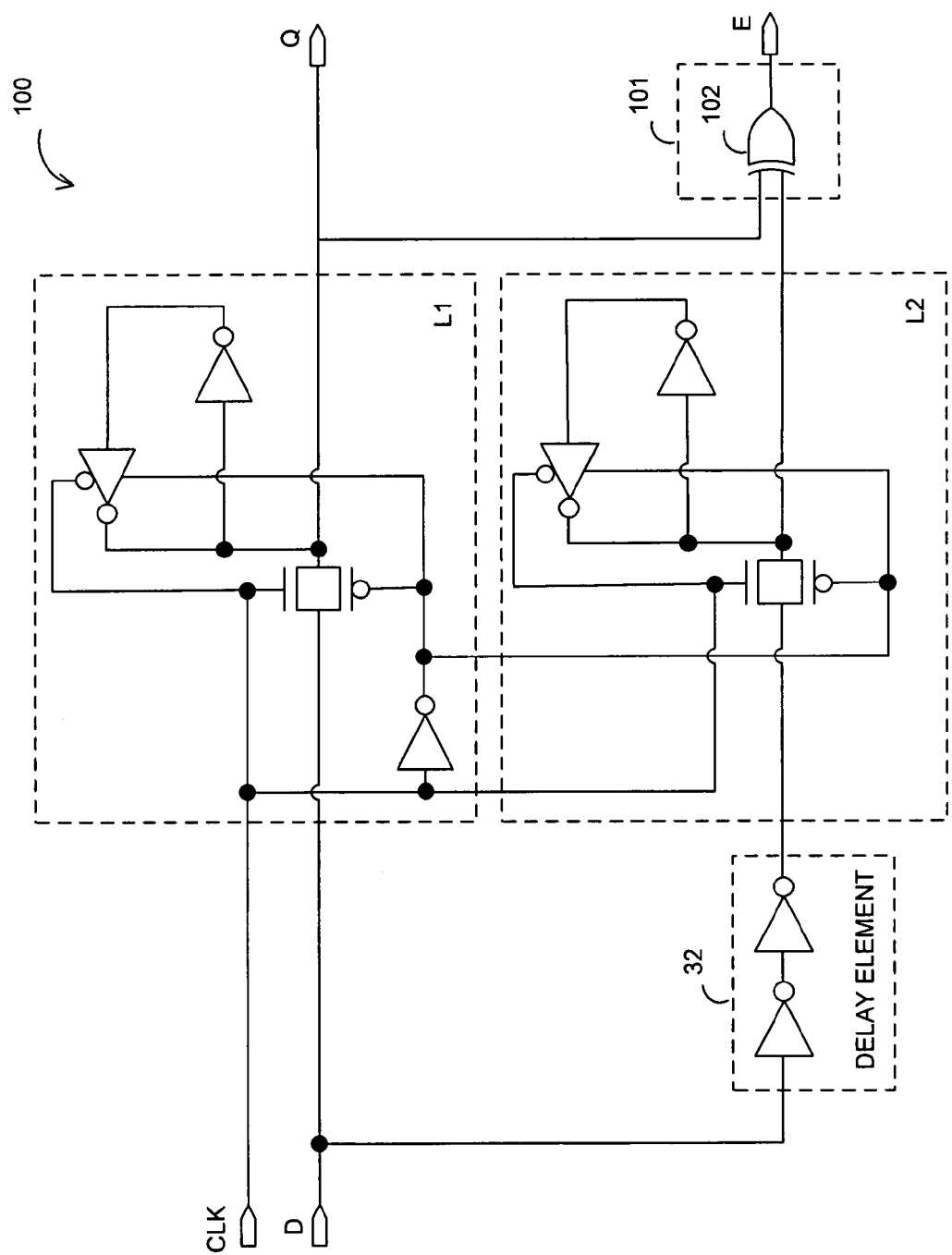
FIG. 7 is a circuit schematic of a shelf-checking latch cell, according to one embodiment of the present invention.

Referring to FIG. 7, the bistable cell 18 of FIG. 1 may take the form of a self-checking latch cell 100. The self-checking latch cell 100 is the same as the hardened latch cell of FIG. 3 except an output joining circuit 101 may take the form of an error detecting circuit instead of a hardening circuit. In one embodiment, the error detecting circuit may be an exclusive OR (XOR) gate 102. The latches L1 and L2 and the delay element 32 have previously been described with respect to FIG. 2 and their description will not be repeated here.

The output terminals of the latches L1 and L2 having the output bistable signals Q1 and Q2 may be referred to as the Q1 and Q2 output terminals, respectively. The XOR gate 102 may compare the outputs of the latches L1 and L2 and if they match (Q1=Q2), the Q output terminal of the XOR gate 102 is a logic value 0 (no flag or error signal). In the event the occurrence of a soft error in either the system latch L1 or the shadow latch L2, these two outputs will likely to have a relative condition of not matching (Q1≠Q2) and the Q output terminal of the XOR gate 102 may be a logic value 1, which may act as an error flag (an error signal) showing the relative condition of a data mismatch. Power consumption of the self-checking latch cell 100 may be similar to the hardened latch cell 30 of FIG. 2, while it may be slightly faster due to the removal of the C-element circuit. The delay overhead of the hardened latch cell 30 of FIG. 2 may be reduced in the self-checking latch cell 100 because the error detection result (output of the XOR 102) may be registered at a later point of the clock cycle, although the second latch L2 takes a delayed version of the data input signal.

In another embodiment (not shown), the bistable cell 18 of FIG. 1 may be a self-checking flip-flop cell. This self-checking flip-flop cell may be similarly derived as the hardened flip-flop cell 90 of FIG. 6. More specifically, the self-checking flip-flop cell may be formed by cascading two of the self-checking latch cells 100 of FIG. 7 into a master-slave relationship. In one embodiment, the output joining circuit, in the form of an error detection circuit, may be placed after the second latch cell (slave latch cell) and does not need to be repeated after the first latch cell (master latch cell).

Figure 8:
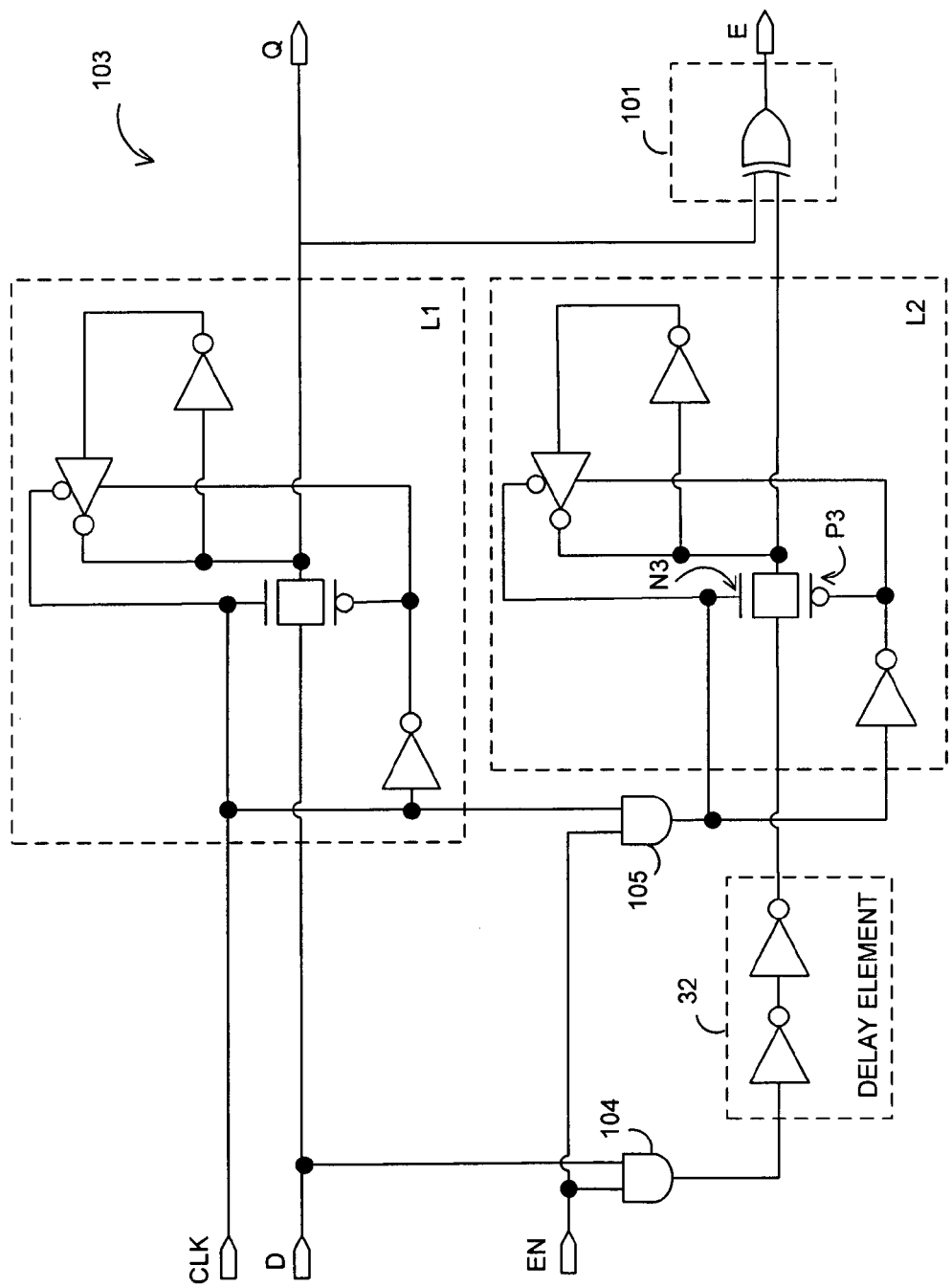
FIG. 8 is a circuit schematic of a shelf-checking latch cell with a non-protected mode of operation, according to one embodiment of the present invention.

Referring to FIG. 8, in one embodiment a non-protected mode of operation may be built into the various embodiments of the bistable cell 18 of FIG. 1 for power-saving purposes or for other purposes. In FIG. 8, the self-checking latch cell 100 of FIG. 7 is shown modified to include the non-protected mode of operation; however, all the embodiments herein also may be modified in this manner to include a non-protected mode of operation that disables the shadow latch or shadow flip-flop, as the case may be. In this illustrative example, the self-checking latch cell 103 of FIG. 8 may have both (a) a self-checking mode of operation and (b) a non-protected mode of operation. For the modified hardening embodiments (not shown), there may be (a) a hardening mode of operation and (b) a non-protected mode of operation. In the non-protected mode, the error-checking or hardening function is turned off so that the bistable cell 18 may consume power comparable to the system latch or system flip-flop by itself. This non-protected mode may provide flexibility, especially for non-critical applications. In other words, when high reliability is desired, the shadow latch L2 (or shadow flip-flop in other embodiments) may be enabled and soft error protection may be achieved. When reliability is not desired, the second latch L2 may be disabled by eliminating its toggling activities.

Referring to FIG. 8, the addition of the non-protected mode of operation may be accomplished by adding a disabling circuit. In one embodiment, the disabling circuit may include AND gates 104 and 105 positioned in the data and clock signal paths, respectively, leading to the shadow latch L2. The AND gate 104 may receive the input of the data input signal D from the combinational logic and the AND gate 105 may receive the system clock signal CLK from the clock source. Both gates 104 and 105 may also receive a control signal EN as a second input. The output and the inverted output from the AND gate 105 may be coupled to the transistors N3 and P3, respectively, to concurrently enable and disable the transistors N3 and P3. Hence, the enable signal EN may enable or disable the self-checking mode (or hardening mode of operation with the hardening embodiments). It is desirable to place the delay element 32 of FIG. 2 in front of the shadow latch L2 when the design includes the non-protected mode of operation, as shown in FIG. 8, so that the delay of the delay element 32 is not incurred during the non-protected mode of operation. On the other hand, if there is no non-protected mode of operation, as in FIG. 2, the delay element 32 may be placed in front of either the shadow latch or the system latch. The rest of FIG. 8 is the same as FIG. 7; hence, it retains the same reference numbers and will not be described again.

Figure 9:
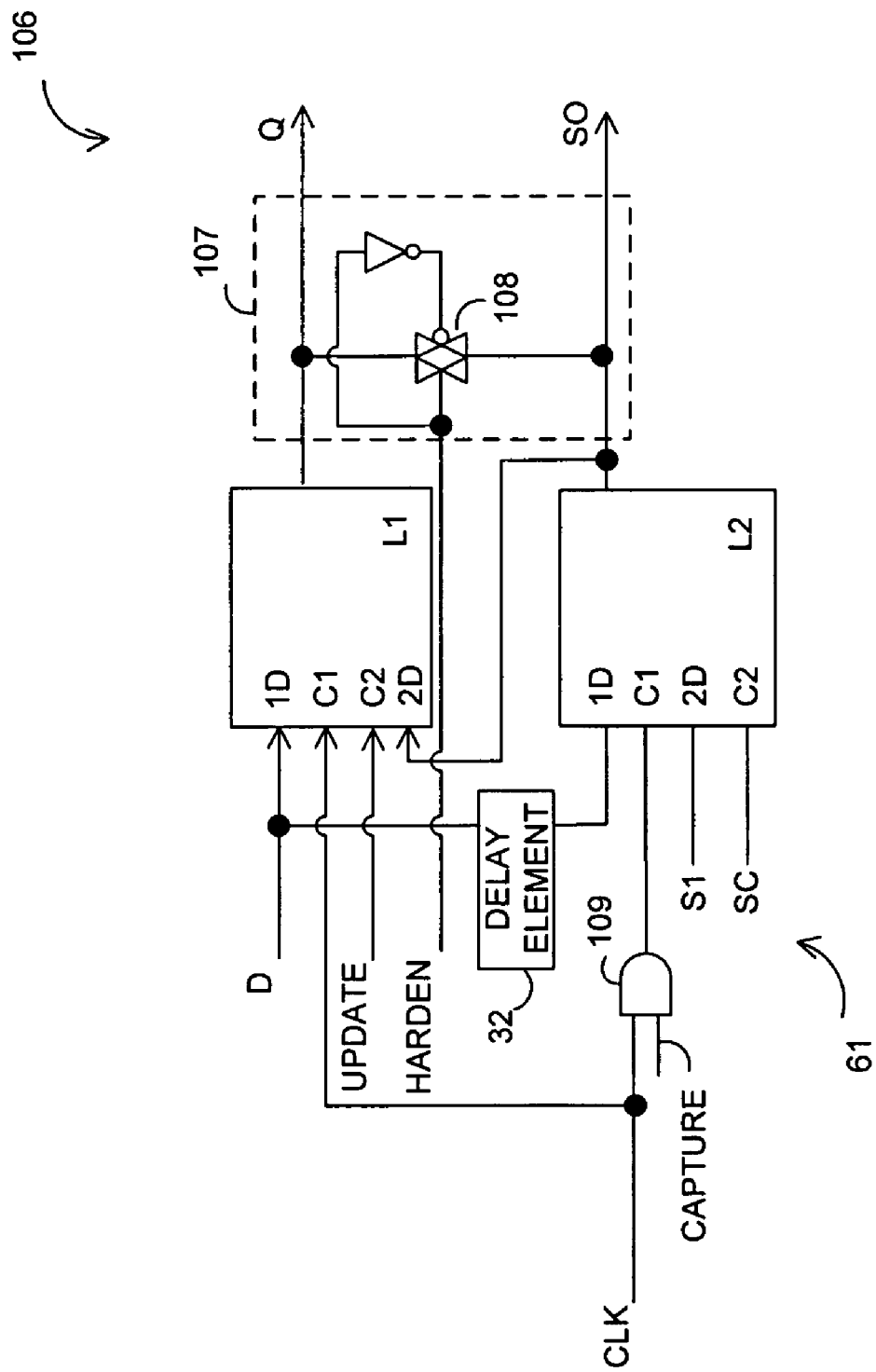
FIG. 9 is a circuit schematic of a hardened latch cell with scan circuit reuse, according to one embodiment of the present invention.

Referring to FIG. 9, the bistable cells 18 of FIG. 1 may include a "reuse" feature wherein the shadow latch L2 may already exist in the form a scan or scanout circuit coupled to the system latch L1. Hence, the scan or scanout circuitry may be reused to protect the system from soft errors. Scan circuitry may be used to avoid the known sequential-test problems by turning the scan circuits of the bistable cells 18 at input and output nodes of combinational logic circuits (see FIG. 1) into externally loadable and readable elements. During this test mode, the scan circuits of the bistable cells 18 of FIG. 1 may be chained together as one or more serial shift registers to form one or more scan paths (sometimes referred to as "scan chain"). In a scan-in shift operation, serial data of an appropriate test pattern or sequence (scan-in signal) may be loaded into the scan circuits of the bistable cells 18 to set each of the cells 18 to a predetermined state. Once set, the test pattern may propagate through the combinational logic circuits to generate a system response to the test pattern. In a capture operation, the bistable cells may function to latch (capture) the system response. In a scan-out shift operation, the system response (scan-out signal SO) may be shifted out of the IC chip (see FIG. 1) and analyzed for improper operation. To implement a scanout function in a chip, one or more shift registers (often referred to as scanout chains) may be arranged in the chip by serially connecting a plurality of bistable cells 18 so as to observe key internal states at various internal test nodes. Such internal nodes frequently are chosen for their strategic importance in the chip's operation (hence, important for debug).

In FIG. 9, one reuse latch cell 106, according to the present invention, is shown wherein there is a system latch L1, a shadow latch L2, and an output joining circuit 107. The delay element 32 previously described in FIG. 2 may be included in the data path before the shadow latch L2. As an alternative to the C-element of FIG. 2 for hardening against errors, the output joining circuit 107, in one embodiment, may include a transmission gate 108. In another embodiment, it may be the C-element shown in FIG. 2. The transmission gate 108 also may be used as a replacement for the C-element in the other hardening cell embodiments. Although a latch cell is shown, each of the embodiments shown herein may be modified so that the shadow latch L2 (or shadow flip-flop) is a scan and/or a scanout circuit.

The system latch L1 may have inputs of a data input signal D, a signal UPDATE, a clock signal CLK, and an output signal of the shadow latch L2. A clock control circuit in the form of an AND gate 109 may have as an input the clock signal CLK and a CAPTURE signal and may have an output coupled to the shadow latch L2. The shadow latch L2 may have inputs of the data input signal D (delayed by the delay element 32), an output from the AND gate 109, a test pattern (scan-in signal SI), and a scan clock signal SC. The transmission gate 108 may be opened and closed in response to an enable signal HARDEN. The system latch L1 has a first output signal Q and the shadow latch L2 has a second output signal SO (scan-out signal). The delay element 32 may take many forms, as described with respect to FIG. 2.

The reuse latch cell 106 may have a test mode and a functional mode of operation. The functional mode may operate with additional resilience against errors. During the test mode, the scan clock SC may clock in the test pattern into the shadow latch L2, the signal UPDATE may move it to the system latch L1 so as to apply the test pattern to a downstream combinational logic circuit (see FIG. 1). The system response from an upstream combinational logic circuit may be fed to both latches L1 and L2 as the data input signal D with the signal CAPTURE high. The scan clock SC then may be used to scan out the system response from the shadow latch L2. In the functional mode, the transmission gate 108 couples the two outputs to provide error reduction by setting the signal HARDEN to high. In one embodiment, the reuse latch cell 106 also may have a non-protected mode. This may be accomplished by setting the signal HARDEN low so that the transmission gate 108 is open and by setting the CAPTURE signal low so that the shadow latch L2 is not clocked; hence, power may be saved. As with the other embodiments, the system latches L1 and L2 may be replaced with a pair of system flip-flops.

For the self-checking embodiments, error trapping may be undertaken for capturing the errors in the self-checking bistable cells. Moreover, the scan or scanout circuitry may be used to remove error signals generated in the self-checking embodiments. After a pre-specified number of clock cycles, system-wide check-pointing may be performed. The scan or scanout circuits along a scan or scanout chain may be formed into a shift register and may be used to shift out the error signals, if any. The use of the scan or scanout shift may eliminate the need for global routing of the error signal. This shifting out of the error signal from the scan or scanout chain may occur at a recovery point (e.g. at a checkpoint); hence, it does not require an extra checking stage. Error correction then may be achieved by re-execution from a previously committed valid check point.

Figure 10:
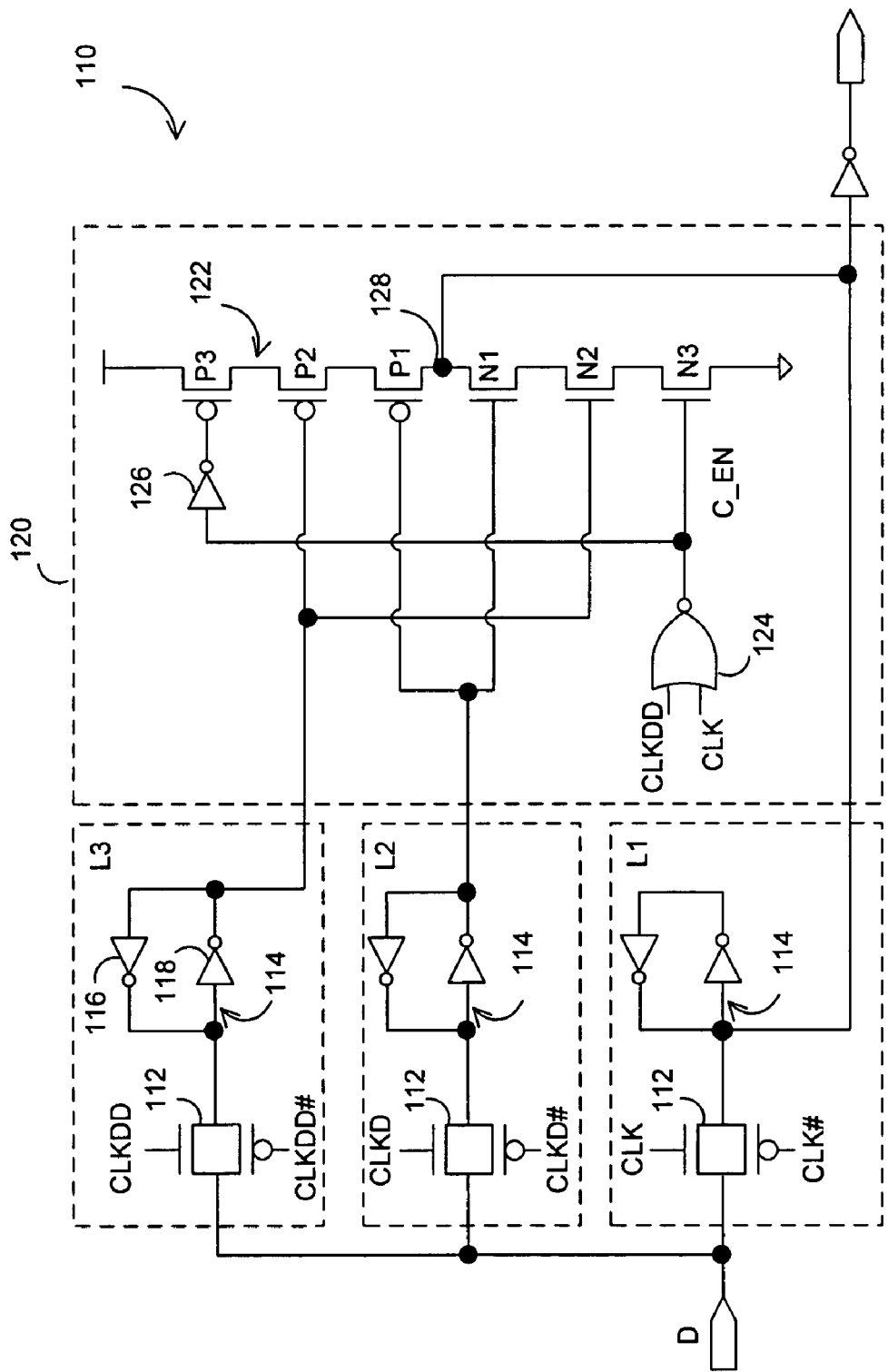
FIG. 10 is a circuit schematic of an error correcting cell, according to one embodiment of the present invention.

Referring to FIG. 10, the bistable cell 18 of FIG. 1 may take the form of an error-correcting latch cell 110, which may include three latches L1, L2 and L3. In one embodiment, each of the latches L1, L2 and L3 may have the same design; hence, the same reference numbers are used for all three latches. In one embodiment, each of the latches L1, L2 and L3 may include a pass gate 112, and a storage element 114 formed by a pair of inverters 116 and 118. The pass gate 112 for latch L1 may include an N-channel transistor coupled to a clock signal CLK and a P-channel transistor coupled to a clock signal CLK#, which is an inverted version of the clock signal CLK. The pass gate 112 for latch L2 may include an N-channel transistor coupled to a clock signal CLKD and a P-channel transistor coupled to a clock signal CLKD#, which is an inverted version of the clock signal CLKD. The pass gate 112 for latch L3 may include an N-channel transistor coupled to a clock signal CLKDD and a P-channel transistor coupled to a clock signal CLKDD#, which is an inverted version of the clock signal CLKDD. In another embodiment, the latches L1, L2, and L3 may each be replaced by a flip-flop.

The error-correcting latch cell 110 may include an output joining circuit 120 in the form of an error correction circuit. In one embodiment, the error correction circuit may include a C-element circuit 122. The C-element circuit 122 may include P-channel transistors P1, P2, and P3 coupled in series in a pull-up path and N-channel transistors N1, N2, and N3 coupled in series in a pull-down path. The gates of transistors P1 and N1 may be coupled to an output of the latch L2. The gates of transistors P2 and N2 may be coupled to an output of the latch L3. A NOR gate 124 may have a pair of inputs, the clock signals CLKDD and CLK, and may have as an output an enable signal C_EN. The enable C_EN may be coupled to a gate of the transistor N3 and to a gate of the transistor P3 through an inverter 126. An output node 128 of the C-element 122 may be coupled the output of the latch L1.

Figure 11:
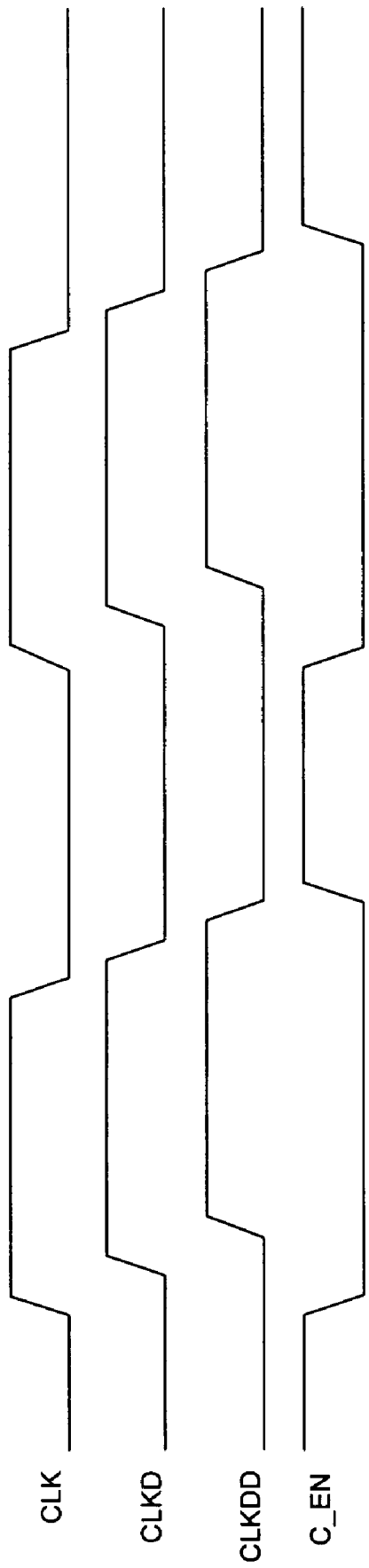
FIG. 11 is a timing diagram for the error correcting latch cell of FIG. 10, according to one embodiment of the present invention.

Referring to the timing diagram of FIG. 11, the clock signals CLK, CLKD, and CLKDD are shown progressively delayed relative to each other. In operation, the main latch L1 (or flip-flop in another embodiment) may latch the data input signal D from the preceding (upstream) combinational logic circuit (see FIG. 1) and let the latched result propagate toward the succeeding stage, regardless whether there has been a soft error or not. While either the signal CLK or CLKDD is high, the NOR gate 124 turns off the transistors P3 and N3; hence, the transistors P3 and N3 are off while the latches L1, L2 and L3 are latching the incoming data input signal D. This is shown in FIG. 11 by the enable signal C—EN being low while the clock signals are high. Generally, the NOR gate 124 may generate the enable signal to disable the C-element circuit 120 when at least one of the first, the second and the third clock signals have a first logic state (e.g., logic value 1 in FIG. 11) and to enable the C-element circuit 120 when the first, second, and third clock signals all have a second logic state (e.g. logic value 0 in FIG. 11). Hence, soft error detection and correction may be achieved in a later stage of the clock cycle when the other two latches (or flip-flops) L2 and L3 have completed latching the incoming data input signal D. Thereafter, a 2-out-of-3 majority "voting" then may be achieved by the C-element circuit 122. This "voting" mechanism for error correction may be undertaken with simple circuitry as described and may have negligible impact on the system performance (D-Q delay) when there are no soft errors. The error correction works if there is enough slack in the succeeding stage. If an SEU flips one of the latches, the outputs of the other two latches will dominate. If a transient from the upstream combinational circuit is latched into one of the latches, it should not be latched into the other latches due to the staggered latching caused by the staggered clock signals CLK, CLKD, and CLKDD.

Figure 12:
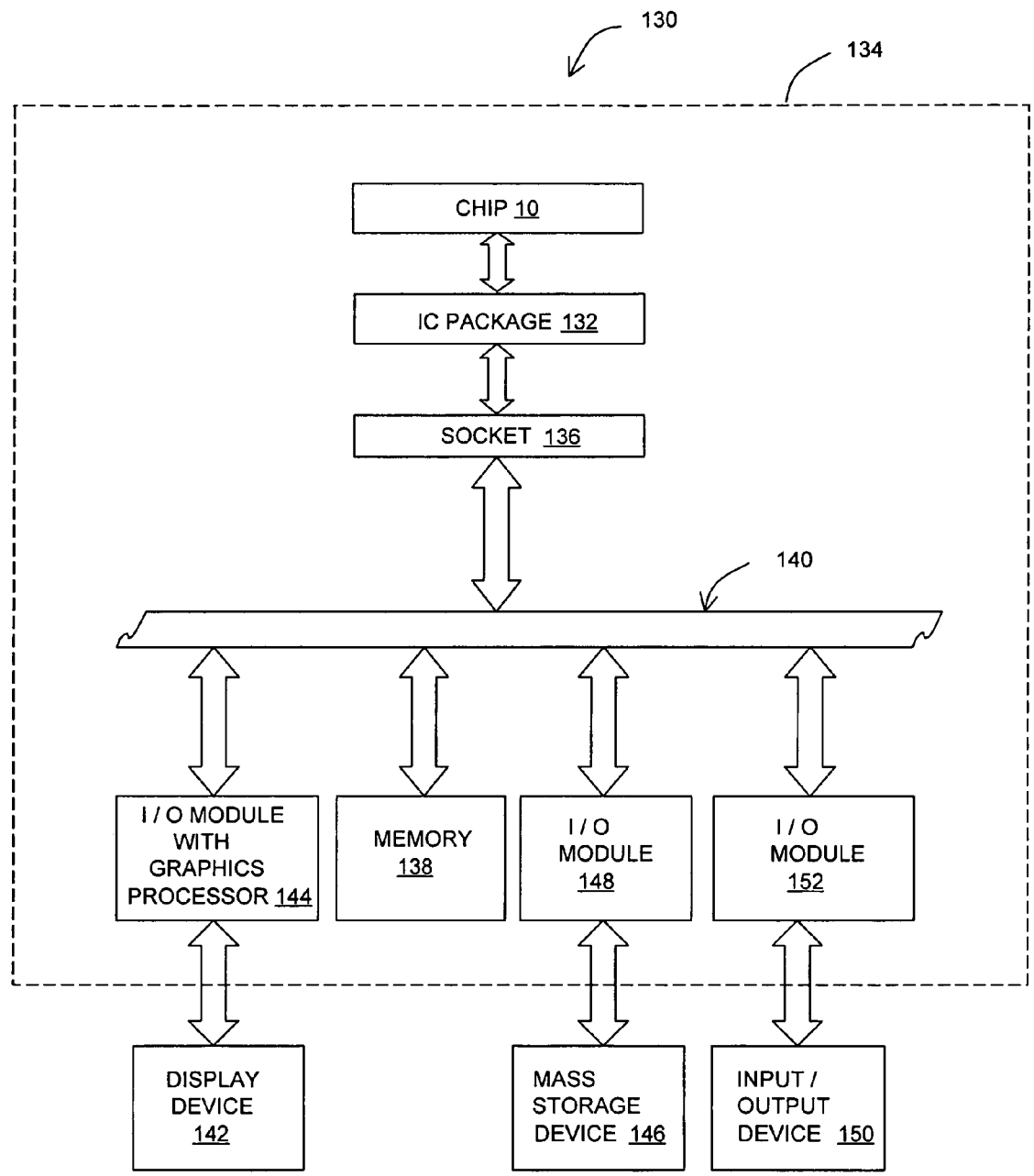
FIG. 12 is a system incorporating the IC chip of FIG. 1, according to the various embodiments of the present invention.

Referring to FIG. 12, there is illustrated a computer system 130, which is one of many possible systems in which an IC package 132 may be used, which includes the IC chip 10 of FIG. 1 according to one embodiment of the present invention. However, the various embodiments of the present invention are applicable to systems other than computer systems, and the computer system 130 is merely illustrative of one application. The IC chip 10 may include the bistable cells 18 of FIG. 1, which may take many different forms, according to the various embodiments of the present invention. In the system 130, the IC package 132 is mounted on a substrate or printed circuit board (PCB) 134 via a socket 136. The IC chip 10 of the IC package 132 may be a processor and the PCB 134 may be a motherboard. In addition to the socket 136 and the IC package 132, the PCB 134 may have mounted thereon a main memory 138 and a plurality of input/output (I/O) modules for external devices or external buses, all coupled to each other by a bus system 140 on the PCB 134. More specifically, the system 130 may include a display device 142 coupled to the bus system 140 by way of an I/O module 144, with the I/O module 144 having a graphical processor and a memory. The I/O module 144 may be mounted on the PCB 134 or may be mounted on a separate expansion board. The system 130 may further include a mass storage device 146 coupled to the bus system 140 via an I/O module 148. Another I/O device 150 may be coupled to the bus system 140 via an I/O module 152. Additional I/O modules may be included for other external or peripheral devices or external buses.

Examples of the main memory 138 include, but are not limited to, static random access memory (SRAM) and dynamic random access memory (DRAM). Examples of the mass storage device 146 include, but are not limited to, a hard disk drive, a compact disk drive (CD), a digital versatile disk driver (DVD), a floppy diskette, a tape system and so forth. Examples of the input/output devices 150 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 134. Examples of the bus system 140 include, but are not limited to, a peripheral control interface (PCI) bus, and Industry Standard Architecture (ISA) bus, and so forth. The bus system 140 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 140. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire). Examples of the IC chip 10 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   a combinational logic circuit to generate a data input signal;
   a delay element, coupled to the combinational logic circuit, to provide a delayed data input signal in response to the data input signal;
   a system bistable circuit, coupled to the combinational logic circuit, to generate a system bistable signal in response to the data input signal;
   a shadow bistable circuit, coupled to the delay element, to generate a shadow bistable signal in response to the delayed data input signal;
   an output joining circuit, coupled to the system and the shadow bistable circuits, to provide a data output signal in response to the system and the shadow bistable signals; and
   a selected one of a scan circuit and a scanout circuit coupled to the system bistable circuit.

2. The apparatus according to claim 1, wherein the system bistable circuit is a system latch and the shadow bistable circuit is a shadow latch.

3. The apparatus according to claim 1, wherein the system bistable circuit is a system flip-flop and the shadow bistable circuit is a shadow flip-flop.

4. The apparatus according to claim 1, wherein the system bistable includes a pair of system latches disposed in a master-slave relationship to form a system flip-flop and the shadow bistable includes a pair of shadow latches disposed in a master-slave relationship to form a shadow flip-flop.

5. The apparatus according to claim 1, wherein the output joining circuit is a hardening circuit configured to couple together the system bistable signal and the shadow bistable signal to generate the data output signal.

6. The apparatus according to claim 1, wherein the output joining circuit is a C-element circuit.

7. The apparatus according to claim 6, wherein the C-element circuit includes an output node on which the data output signal is provided; the apparatus further comprising:
a keeper circuit coupled to the output node.

8. The apparatus according to claim 1, wherein
the output joining circuit is a C-element circuit;
the system bistable circuit includes a system output terminal on which the system bistable signal is provided;
the shadow bistable circuit includes a shadow output terminal on which the shadow bistable signal is provided; and
the C-element circuit includes at least one system transistor having a system gate coupled to the system output terminal and at least one shadow transistor having a shadow gate coupled to the shadow output terminal.

9. The apparatus according to claim 1, wherein the output joining circuit is a transmission gate.

10. The apparatus according to claim 1, wherein the output joining circuit is an error detection circuit.

11. The apparatus according to claim 1, wherein the output joining circuit is an exclusive-OR gate.

12. The apparatus according to claim 1, wherein
the system bistable circuit includes a system data input terminal and a system clock input terminal;
the shadow bistable circuit includes a shadow data input terminal and a shadow clock input terminal;
the system and the shadow clock input terminals are commonly coupled to receive a clock signal;
the system data input terminal is coupled to the combinational logic circuit to receive the data input signal; and
the shadow data input terminal is coupled to the delay element to receive the delayed data input signal.

13. An apparatus, comprising:
a combinational logic circuit to generate a data input signal;
a delay element, coupled to the combinational logic circuit, to provide a delayed data input signal in response to the data input signal;
a system bistable circuit, coupled to the combinational logic circuit, to generate a system bistable signal in response to the data input signal;
a shadow bistable circuit, coupled to the delay element, to generate a shadow bistable signal in response to the delayed data input signal; and
an output joining circuit, coupled to the system and the shadow bistable circuits, to provide a data output signal in response to the system and the shadow bistable signals;
wherein the output joining circuit is a C-element circuit;
the system bistable circuit includes a system output terminal on which the system bistable signal is provided;
the shadow bistable circuit includes a shadow output terminal on which the shadow bistable signal is provided; the C-element circuit includes an output node on which the data output signal is provided; the C-element circuit further includes a pull-up path coupled between a supply voltage and the output node and a pull-down path coupled between the output node and a ground; the pull-up path includes a first and a second P-channel transistor coupled in series with a gate of the first P-channel transistor being coupled to the shadow output terminal and a gate of the second P-channel transistor being coupled to the system output terminal; and the pull-down path includes a first and a second N-channel transistor coupled in series with a gate of the first N-channel transistor being coupled to the system output terminal and a gate of the second N-channel transistor being coupled to the shadow output terminal.

14. An apparatus, comprising:
a combinational logic circuit to generate a data input signal;
a delay element, coupled to the combinational logic circuit, to provide a delayed data input signal in response to the data input signal;
a system bistable circuit, coupled to the combinational logic circuit, to generate a system bistable signal in response to the data input signal;
a shadow bistable circuit, coupled to the delay element, to generate a shadow bistable signal in response to the delayed data input signal;
an output joining circuit, coupled to the system and the shadow bistable circuits, to provide a data output signal in response to the system and the shadow bistable signals; and
a control circuit coupled to the shadow bistable circuit to disable the shadow bistable circuit during a non-protected mode of operation.

15. The apparatus according to claim 14, wherein the system bistable circuit is a system latch and the shadow bistable circuit is a shadow latch.

16. The apparatus according to claim 14, wherein the system bistable circuit is a system flip-flop and the shadow bistable circuit is a shadow flip-flop.

17. The apparatus according to claim 14, wherein the system bistable includes a pair of system latches disposed in a master-slave relationship to form a system flip-flop and the shadow bistable includes a pair of shadow latches disposed in a master-slave relationship to form a shadow flip-flop.

18. The apparatus according to claim 14, wherein the output joining circuit is a hardening circuit configured to couple together the system bistable signal and the shadow bistable signal to generate the data output signal.

19. The apparatus according to claim 14, wherein the output joining circuit is a C-element circuit.

20. The apparatus according to claim 19, wherein the C-element circuit includes an output node on which the data output signal is provided; the apparatus further comprising:
a keeper circuit coupled to the output node.

21. The apparatus according to claim 14, wherein
the output joining circuit is a C-element circuit;
the system bistable circuit includes a system output terminal on which the system bistable signal is provided;
the shadow bistable circuit includes a shadow output terminal on which the shadow bistable signal is provided; and
the C-element circuit includes at least one system transistor having a system gate coupled to the system output terminal and at least one shadow transistor having a shadow gate coupled to the shadow output terminal.

22. The apparatus according to claim 14, wherein the output joining circuit is a transmission gate.

23. The apparatus according to claim 14, wherein the output joining circuit is an error detection circuit.

24. The apparatus according to claim 14, wherein the output joining circuit is an exclusive-OR gate.

25. An apparatus, comprising:
a combinational logic circuit to generate a data input signal;
a delay element, coupled to the combinational logic circuit, to provide a delayed data input signal in response to the data input signal;

a system bistable circuit, coupled to the combinational logic circuit, to generate a system bistable signal in response to the data input signal;

a shadow bistable circuit, coupled to the delay element, to generate a shadow bistable signal in response to the delayed data input signal;

an output joining circuit, coupled to the system and the shadow bistable circuits, to provide a data output signal in response to the system and the shadow bistable signals; and a scan circuit coupled to the system bistable circuit; and wherein the system and the shadow bistable circuits are configured to generate the system and the shadow bistable signals, respectively, during a functional mode of operation; and the scan circuit is adapted to generate a scan-out signal in response to a scan-in signal and at least one scan clock signal during a test mode of operation.

26. An apparatus, comprising:

a first bistable circuit adapted to generate a first bistable signal in response to a data input signal and a first clock signal;

a second bistable circuit adapted to generate a second bistable signal in response to the data input signal and a second clock signal, the second clock signal being delayed with respect to the first clock signal;

a third bistable circuit adapted to generate a third bistable signal in response to the data input signal and a third clock signal, the third clock signal being delayed with respect to the second clock signal; and an output joining circuit, coupled to the first, the second, and the third bistable circuits, to provide a data output signal in response to the first, the second, and the third bistable signals.

27. The apparatus according to claim 26, comprising:

a combinational logic circuit to generate the data input signal; and wherein the first, the second, and the third bistable circuits are coupled to the combinational logic circuit.

28. The apparatus according to claim 26, wherein the output joining circuit includes a C-element circuit.

29. The apparatus according to claim 28, wherein the C-element circuit includes an output node, coupled to an output terminal of the first bistable element;

a pull-up path coupled between a supply voltage and the output node and a pull-down path coupled between the output node and a ground;

the pull-up path includes a first, a second, and a third P-channel transistor coupled in series;

the pull-down path includes a first, a second, and a third N-channel transistor coupled in series;

a gate of the first P-channel transistor and a gate of the first N-channel transistor coupled to the second bistable circuit to receive the second bistable signal;

a gate of the second P-channel transistor and a gate of the second N-channel transistor coupled to the third bistable circuit to receive the third bistable signal; and a gate of the third P-channel transistor and a gate of the third N-channel transistor coupled to a control signal to enable and disable the C-element circuit.

30. The apparatus according to claim 29, wherein the output joining circuit further includes a logic gate, adapted to receive the first and the third clock signals, and in response, generate the control signal.

31. The apparatus according to claim 30, wherein logic gate is designed to generate the control signal to disable the C-element circuit when at least one of the first, the second and the third clock signals has a first logic state and to enable the C-element circuit when the first, the second, and the third clock signals have a second logic state.

32. A method, comprising:

generating a first bistable signal in response to a data input signal and a first clock signal;

generating a second bistable signal in response to data input signal and a second clock signal, the second clock signal being delayed with respect to the first clock signal;

generating a third bistable signal in response to the data input signal and a third clock signal, the third clock signal being delayed with respect to the second clock signal; and providing a data output signal in response to the first, the second, and the third bistable signals.

33. The method according to claim 32, wherein the providing of the data output signal includes joining together the first, the second, and the third bistable signals with an error hardening circuit to generate the data output signal.

34. The method according to claim 32, wherein the providing of the data output signal includes joining together the first, the second, and the third bistable signals with an error detecting circuit.

* * * * *

UNITED STATES PATENT AND TRADEMARK OFFICE
CERTIFICATE OF CORRECTION

PATENT NO.       : 7,523,371 B2                                       Page 1 of 1
APPLICATION NO.  : 11/218979
DATED            : April 21, 2009
INVENTOR(S)      : Subhasish Mitra et al.

It is certified that error appears in the above-identified patent and that said Letters Patent is hereby corrected as shown below:

Column 16
Lines 28-29, "...to data input signal..." should read --...to the data input signal...--.

Signed and Sealed this

Fifth Day of October, 2010

David J. Kappos
*Director of the United States Patent and Trademark Office*